United States Patent [19]

Hoshino et al.

[11] Patent Number: 5,096,878

[45] Date of Patent: Mar. 17, 1992

[54] METHOD FOR PRODUCTION OF BI-CONTAINING SUPERCONDUCTING CERAMICS LAMINATES

[75] Inventors: Kazutomo Hoshino, Ageo; Shigeru Yamazaki, Gyoda; Hidefusa Takahara, Chofu; Masao Fukutomi, Tsukuba, all of Japan

[73] Assignees: Mitsui Kinzoku Kogyo Kabushiki Kaisha; Agency; Science and Technology; National Research Institute for Metals, all of Tokyo, Japan

[21] Appl. No.: 647,216

[22] Filed: Jan. 28, 1991

Related U.S. Application Data

[63] Continuation of Ser. No. 330,276, Mar. 29, 1989, abandoned.

[30] Foreign Application Priority Data

Mar. 31, 1988 [JP] Japan .................. 63-80020
Mar. 31, 1988 [JP] Japan .................. 63-80021

[51] Int. Cl.$^5$ .................... B05D 3/02; B05D 5/12
[52] U.S. Cl. ..................... 505/1; 505/741; 505/742; 427/62; 427/282
[58] Field of Search ............ 505/1, 742, 741, 731, 505/732, 734, 735, 737; 427/62, 63, 96, 282

[56] References Cited

PUBLICATIONS

Tachikawa et al., "Preparation of Y—Ba—Cu Oxide Superconducting Composite Tapes by a Diffusion Process", MRS vol. 99 (Nov. 1987) pp. 727–730.
Gurvitch et al., "Preparation and Substract Reactions of Superconducting Y—Ba—Cu—O Films", Appl. Phys. Lett. 51 (13) Sep. 1987, pp. 1027–1029.
Hashimoto et al., "Superconductivity and Substrate Interaction of Screen-Printed Bi—Sr—Ca—Cu—O Films", Jpn J. Appl. Phys. 27 (3) Mar. 1988, L384–386.
Nakao et al., "Magnetron Sputtering of Bi—Ca—Sr—Cu—O Thin Films With Superconductivity Above 80 k", Jpn J. Appl. Phys. 27 (3) Mar. 1988, L378—380.
Chien et al., "Effect of Noble Metal Buffer Layers on Superconducting $YBa_2Cu_3O_7$ Thin Films", Appl. Phys. Lett. 51 (25) Dec. 1987, pp. 2155–2157.
Koinuma et al., "Some Problems in the Preparation of Superconducting Oxide Films on Ceramic Substrates", Jpn. J. Appl. Phys. 26 (5) May 1987, L763–765.
Kang et al., "High Critical Field Anisotrophy of Superconducting Bi—Sr—Ca—Cu Oxide from Highly Oriented Thin Films", Appl. Phys. Lett. 52 (24) Jun. 1988, pp. 2080–2082.
Harker et al., "Reactive Ion Beam Deposition of Thin Films in the Bismuth-Calcium-Strontium-Copper Oxide Ceramic Superconductor System", Appl. Phys. Lett. 52 (25) Jun. 1988, pp. 2186–2187.
Lorentz et al., "Oriented High–Temperature Superconducting Bi—Sr—Ca—Cu—O Thin Films Prepared by Ion Beams Deposition", Appl. Phys. Lett. 53 (17) Oct. 1988, pp. 1654–1656.
Agostinelli et al., "Superconducting Thin Films in the Bi—Sr—Ca—O System by the Decomposition of Metallo-Organic Precursors", Physica C156 (1988) pp. 208–212.

Primary Examiner—Shrive Beck
Assistant Examiner—Roy V. King
Attorney, Agent, or Firm—Stevens, Davis, Miller & Mosher

[57] ABSTRACT

A method for making superconductive ceramics laminates comprises forming a thick film of a composite oxide comprising bismuth, strontium, calcium, copper and oxygen on a flat plane of a substrate, and orienting and crystallizing the thus formed film by heat treatment to cause the c-axis of composite oxide crystals to be substantially perpendicular to said flat plane of said substrate. An intermediate layer formed of a noble metal, MgO, $SrTiO_3$, yttria-stabilized zirconia or an oxide of a superconductive ceramics-constituting element may be interposed between the film and the substrate.

2 Claims, 9 Drawing Sheets

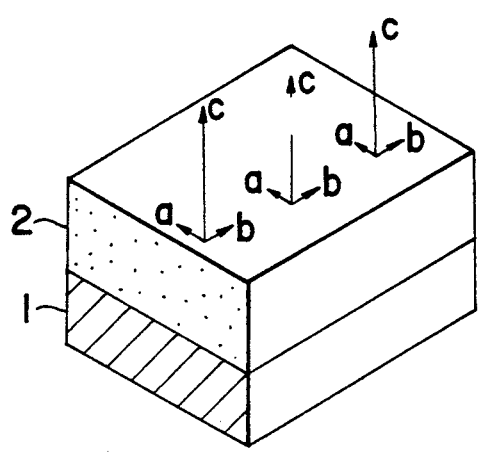
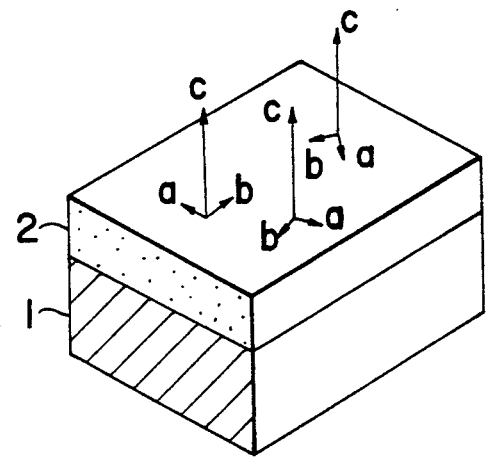
FIG. 1A    FIG. 1B
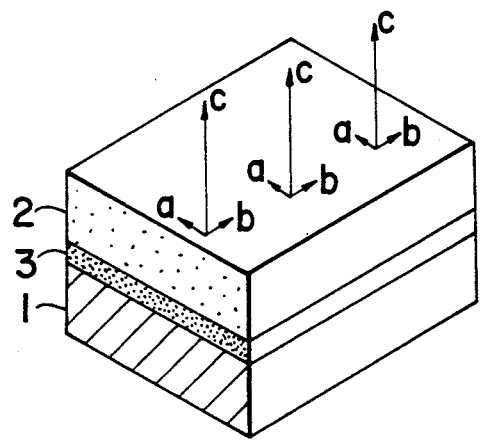
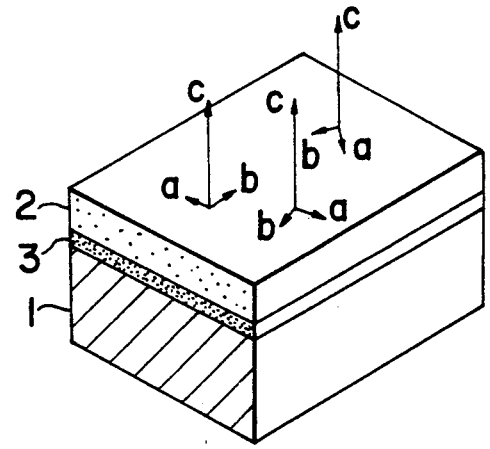
FIG. 2A    FIG. 2B

METHOD FOR PRODUCTION OF BI-CONTAINING SUPERCONDUCTING CERAMICS LAMINATES

This application is a continuation of application Ser. No. 330,276, filed Mar. 29, 1989, now abandoned.

BACKGROUND OF THE INVENTION

1. Field of the Invention

This invention relates to a superconductive ceramics laminate comprising bismuth (Bi), strontium (Sr), calcium (Ca), copper (Cu) and oxygen and, more particularly, a superconductive ceramics laminate based on Bi—Sr—Ca—Cu—O which is formed with a film of composite oxide crystals oriented in a specific direction and to a method for producing such a laminate.

2. Statement of the Prior Art

Superconductors are materials showing the property (superconduction) of reducing their electrical resistance to zero under such conditions as defined by values equal to or lower than critical values represented by the critical temperature Tc, critical magnetic field Hc and critical current density Jc.

Known as oxide ceramics showing superconductivity at about 90K is a composite oxide based on Y—Ba—Cu—O. Recently, another superconductive ceramic based on Bi—Sr—Ca—Cu—O has been discovered as a composite oxide having a Tc of 80 to 110K. Such Bi—Sr—Ca—Cu—O systems are more stable and resistant to external environments such as moisture than the Y—Ba—Cu—O systems.

Ordinarily, such composite oxide ceramics is obtained by sintering a compact of starting ceramics powders, under pressure or on an atmosphere.

Nb—Ti or $Nb_3Sn$ alloys have been known as the superconductive materials practically used in the form of wires, tapes and coils. However, these materials have to be cooled to the temperature of liquid helium at considerable expense.

Various proposals have thus been made to put to practical use wire and tapes using high-temperature superconductors comprising composite oxides having high critical temperatures.

In order to put superconductors to practical use, it is necessary that they can be formed into wires and tapes and that they have a large critical current density, Jc. Although not clarified, the crystal structure of the superconductive ceramics based on Bi—Sr—Ca—Cu—O, as proposed, is characterized in that, of the crystal axes, the c-axis is much longer in length, say, five times or more as long as the a- or b-axis, and the atoms are arranged and stratified on the ab-plane. In a superconductive state, therefore, it is theoretically considered that electrons migrate along the ab-plane (perpendicular to the c-axis), but hardly move along the c-axis.

In wires and coils using conventional high-temperature superconductive ceramics, little attention is paid to such a crystal structure. Nor is any practically high current density obtained without providing means for passing large currents through wires and tapes in their longitudinal direction.

Vapor-phase techniques such as vapor deposition, sputtering and CVD have been proposed as the processes for orienting crystals as mentioned above to pass large currents through wires and tapes in their lengthwise direction. However, problems with these techniques are that films are produced through complicated steps at low rates and very high costs, thus making it difficult to process them into continuous forms such as wires and tapes.

An object of the present invention is to provide a superconductive ceramics laminate showing a critical current density so practically high that when the laminate is formed into a wire or tape, a large current can be passed therethrough in the lengthwise direction. Another object of the invention is to provide a method for making superconductive ceramics laminates of satisfactory crystal orientation in a simple and inexpensive manner.

There is also a need in this field for heat treatments at high temperatures, which leads to the necessity of using heat-resistant materials such as heat-resistant alloys as substrates. When ceramics films are formed directly on substrates of heat-resistant alloys, however, difficulty is encountered in obtaining oriented films due to the poor coherency in terms of the lattice constants therebetween. Further, the superconductive phases of ceramics fail due to a reaction occurring between the ceramics and the substrates during a heat treatment.

Thus, a further object of the present invention is to provide a superconductive ceramics laminate which shows a critical current density so practically high that when it is formed into a wire or tape, a large current can be passed therethrough in its longitudinal direction, and for which various heat-resistant materials can be used as the substrate, and to provide a method for making superconductive ceramics laminates of satisfactory crystal orientation in a simple and inexpensive manner.

SUMMARY OF THE INVENTION

According to the present invention in a first aspect thereof, there is provided a method for producing superconductive ceramics laminates which is characterized in that a thick film of a composite oxide comprising bismuth, strontium, calcium, copper and oxygen is formed on a flat plane of a metal substrate in the form of a tape, etc., and the thus formed film is oriented and crystallized by heat treatment to cause the c-axis of composite oxide crystals to be substantially perpendicular to said flat plane of the substrate.

In a preferred embodiment of this invention, the substrate is selected from metals and alloys such as silver, copper, gold, platinum, nickel and their alloys.

In a further preferred embodiment of this invention, in the heat treatment of the film, it is heated to a temperature of 860° to 900° C. to melt a part or the whole thereof and, thereafter, gradually cooled.

The superconductive ceramics laminate according to this invention is a laminate in which the film of composite oxide ceramics comprising bismuth, strontium, calcium, copper and oxygen is formed on a flat plane of a metal substrate in the form of a tape, etc., and which is characterized in that the composite oxide crystals in the film are oriented to cause their c-axis to be substantially perpendicular to the flat plane of the substrate.

According to the present invention in a second aspect thereof, there is provided a method for producing the superconductive film ceramics laminates according to this invention which comprises forming a thick film of a composite oxide comprising bismuth, strontium, calcium, copper and oxygen on a substrate's flat plane over an intermediate layer and heat-treating the thus formed film to form a ceramics laminate, and which is characterized in that composite oxide crystals are oriented by the heat-treatment to cause their c-axis to be substantially perpendicular to a flat plane of the intermediate layer, said intermediate layer serving to promote said orientation and having no adverse influence upon the superconductivity of the ceramics during the heat-treatment.

In a preferred embodiment of this invention, the substrate is a heat-resistant or high-strength material in the form of a tape.

In this invention, it is desirable that, as the intermediate layer, use be made of a noble metal selected from silver, copper, gold, platinum, MgO, $SrTiO_3$, yttria-stabilized zirconia and an oxide of a superconductive ceramics-constituting element.

In this invention, preferable conditions for heat-treating the film are that the film is partly or wholly melted by heating to a temperature of 860° to 950° C. and then gradually cooled.

The superconductive ceramics laminate according to this invention is a laminate in which the film of composite oxide ceramics comprising bismuth, strontium, calcium, copper and oxygen is formed on a flat plane of the substrate over the intermediate layer comprising a noble metal selected from silver, copper, gold and platinum, MgO, $SrTiO_3$, yttria stabilized zirconia or an oxide of a superconductive ceramics-constituting element, and which is characterized in that the composite oxide crystals in the film are oriented to cause their c-axis to be substantially perpendicular to the flat plane of the intermediate layer.

In the laminate of this invention, the substrate is preferably in the form of a tape formed of a heat-resistant metal, ceramics or a metal/ceramics composite material.

BRIEF DESCRIPTION OF THE DRAWINGS

In the drawings:

FIGS. 1A, 1B, 2A and 2B are schematic perspective views respectively showing two embodiments of the laminate according to this invention;

DETAILED DESCRIPTION OF THE INVENTION

Formation of Composite Oxide Film

Figure 3:
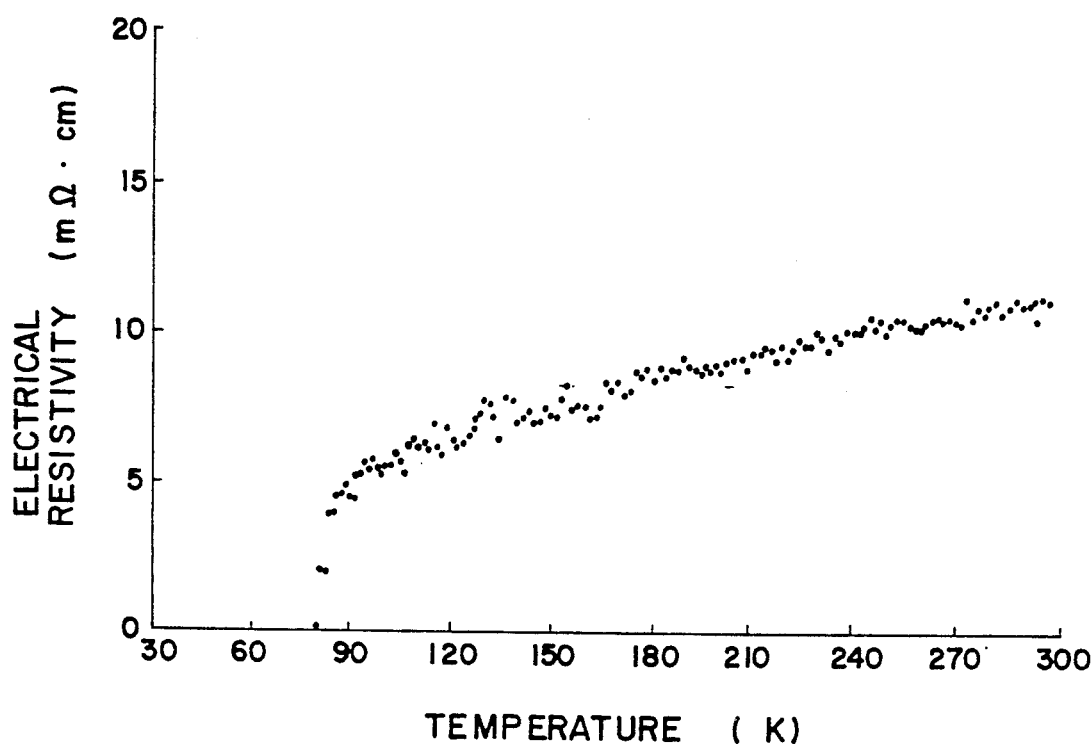
FIG. 3 is a graph indicating the relationship between temperature and electrical resistivity of the composite oxide ceramics obtained in Example 1 set forth hereinafter.

The formation of the composite oxide film on the substrate directly or over the intermediate layer may be suitably carried out by various methods including, e.g., screen printing, doctor blading and solution coating.

Depending on the purpose, the thickness of the composite oxide film varies between several $\mu m$ and hundreds of $\mu m$.

It is desirable that the types of starting compounds for ceramics be selected according to the intended purpose, while taking into consideration the film-forming methods applied.

General methods for obtaining the starting powders for ceramics include, e.g., the dry-type methods wherein the powders of ceramics-constituting compounds are dried together and calcined and the wet-type methods wherein a mixed solution containing the constituents of the end ceramics is prepared, and a precipitant such as oxalic acid or potassium carbonate is added thereto in a single- or multi-stage manner to obtain co-precipitates, after which drying and calcination are carried out.

In this invention, the composite oxide film is formed on the flat plane of the intermediate layer on the substrate. The substrate is preferably in the continuous form of, e.g., a tape or rectangular wire, inter alia a tape, although it may assume any substantially flat-plane shape enabling orientation and crystallization.

The substrate used in this invention is a noble metal and alloy such as silver, copper, gold and platinum or nickel and their alloys, particular preference being given to silver. This is because silver exhibits low reactivity with superconductive ceramics films so that it will not damage the superconductive phases and has good adhesiveness with respect thereto. If required, the substrate is subjected to suitable surface treatments.

When the film is formed by screen printing, a paste of the composite oxide is prepared and coated onto the flat plane of the substrate.

In this case, the paste can be prepared by kneading the composite oxide powders obtained in a conventional manner with a binder such as an acrylic resin and adding to the kneaded product a solvent, a plasticizer or the like to regulate the viscosity of the paste.

The substrate used in the present invention may include, in addition to the above mentioned noble metals, various metals, ceramics and composite materials thereof, which can be suitably selected depending upon the purposes and types of the laminates obtained according to this invention. Preferred to this end are heat-resistant metals and ceramics materials as well as materials having mechanical strength which, if required, are subjected to suitable surface treatments. It is noted, however, that most of such materials have poor coherency with superconductive ceramics films so that when they are used as the substrates, it is necessary to interpose an intermediate layer therebetween.

As the intermediate layer formed on the substrate in this invention, use may be made of any type of material that serves to promote the orientation of ceramics and has no adverse influence upon the superconductivity of ceramics during heat treatment. Usable to this end are, for instance, a noble metal selected from silver, copper, gold and platinum, MgO, $SrTiO_3$, yttria-stabilized zirconia and an oxide of a superconductive ceramics-constituting element, viz., $Bi_2O_3$, SrO, CaO or CuO. Among these materials, the noble metal selected from silver, copper, gold and platinum is less reactive with superconductive phases and serves to promote the orientation of superconductive ceramics crystals, whereas MgO and $SrTiO_3$ are less reactive with superconductive phases with the lattice constants showing good coherency, so that they act to promote the orientation of superconductive ceramics crystals. On the other hand, the oxides of superconductive ceramics-constituting elements such as $Bi_2O_3$, SrO, CaO and CuO are unlikely to give rise to failures of superconductive phases, even when a part of the intermediate layer diffuses into and combines with the superconductive phases, so that they show an increased adhesion with respect to the film and play a barrier role against atoms diffusing from the substrate.

The formation of the intermediate layer on the substrate can be carried out by any of various processes that are suitably selected according to the type of intermediate layer used. For instance, the noble metals can be formed on the substrate by vapor-phase processes such as plating, melt plating and vapor deposition, and the oxides by screen printing, doctor blading, solution coating and the like. Depending on the necessity, the resulting films are dried and fired.

When the film is formed by screen printing, a paste of the composite oxide is prepared and coated onto the flat plane of the intermediate layer.

In this case, the paste can be prepared by kneading the composite oxide powders obtained in a conventional manner with a binder such as an acrylic resin and adding to the kneaded product a solvent, a plasticizer and the like to regulate the viscosity of the paste.

In order to regulate the sinterability and superconductivity of the superconductive ceramics in this invention, trace amounts of certain components can be added thereto. Examples of elements for such components are Pb, Ti, Sn, Mn, Al, Cs, Ce, V, Bi, Ir, Rh and Ga. Such components may be added in the form of their compounds such as hydroxides, oxychlorides, carbonates, bicarbonates, oxynitrates, sulfates, sulfites, nitrates, acetates, formates, oxalates, chlorides and fluorides. Such trace amounts of components can be contained in the starting or calcined composite oxide powders.

Heat-Treatment of Films

The composite oxide film formed on the substrate or the flat plane of the intermediate layer thereon is then heat-treated. According to this invention, the heat-treatment causes the c-axis of the composite oxide crystals to be oriented substantially perpendicular to the flat plane of the intermediate layer.

Referring to the conditions for heat-treating the film, a suitable choice is made from the pre-treatments, heating rates, heating temperatures, heating atmospheres, heating periods of time, cooling rates and the like to achieve the c-axis orientation as mentioned above.

The composite oxide film formed as a paste is dried at about 100° C. and is then desirably pre-treated by annealing at about 400° C. for 1 hour to evaporate off the binder such as a resin.

The heating (firing) temperature is, e.g., 860° to 950° C., preferably 870° to 910° C., although it can be varied depending upon the compositions of composite oxides, etc. This is because at below 860° C., neither melting of the composite oxide film nor c-axial orientation of crystals takes place, and no melting of a part of ceramics grains in the film occurs so that the densification of the film does not proceed. At a temperature higher than 950° C., it is likely that the composite oxide may decompose thermally or a part thereof may evaporate off.

The heating rate is determined depending upon the types and contents of composite oxide constituents, since it has a significant influence upon the microstructure and superconductive characteristics of ceramics.

In this invention, heating is carried out in an oxygenous or non-oxygenous atmosphere. Besides oxygen, a nitrogen gas or an inert gas such as helium or argon can also be additionally provided.

After heating, gradual cooling is applied for c-axial orientation and crystallization. For instance, the cooling rate applied is 500° to 20° C./hour, preferably 200° to 50° C./hour, more preferably about 100° C./hour.

Composite Oxide Ceramics

The superconductive ceramics laminate according to the first aspect of this invention is a laminate in which a composite oxide ceramics film comprising bismuth, strontium, calcium, copper and oxygen is formed on a flat plane of a metal substrate in the form of a tape, etc. and which is characterized in that composite oxide crystals in the film are subjected to c-axial orientation with the c-axis being substantially perpendicular to the flat plane of the substrate.

In this invention, the composite oxide crystals in the film may take on any shape and size as long as they are subjected to c-axial orientation. FIGS. 1A and B are schematical views of one laminate of this invention. In the illustrated embodiment of the invention, the laminate comprises a tape-like metal substrate 1 and a composite oxide ceramics film 2 formed on the flat plane thereof, in which the crystals have their c-axes substantially perpendicular to the flat plane of the substrate. It is here noted that this invention encompasses embodiments thereof wherein the a- and b-axial directions are or are not in coincidence.

The superconductive ceramics laminate according to the second aspect of this invention is a laminate in which a superconductive composite oxide ceramics film comprising bismuth, strontium, calcium, copper and oxygen is formed over an intermediate layer comprising a metal selected from silver, copper, gold and platinum, MgO, $SrTiO_3$, yttria-stabilized zirconia or an oxide of a superconductive ceramics-constituting element on a flat plane of a substrate that is in the form of, e.g. a tape and is a heat-resistant metal, ceramics or a metal/ceramics composite material, said laminate being characterized in that composite oxide crystals in the film are oriented to cause the c-axis to be substantially perpendicular to the flat plane of the intermediate layer.

In this invention, the composite oxide crystals in the film may assume on any shape and size as long as they are oriented along the c-axis. FIGS. 2A and B are schematical views, partly sectioned, of another laminate of this invention. In this embodiment, the laminate comprises a tape-like metal substrate 1 and a composite oxide ceramic film 2 provided on the plane thereof over an intermediate layer 3, in which the crystals have their c-axes substantially perpendicular to the flat plane of the intermediate layer. It is to be noted that this invention encompasses embodiments in which the a- and b-axes are or are not in agreement (as shown in FIGS. 2A or 2B).

The thus prepared ceramics can show superconductivity and be used as various superconductive materials.

For a better understanding of this invention, reference will now be made specifically but not exclusively to the mechanism of the method of the ceramics produced according to this invention.

In the method of this invention, the ceramic particles in the composite oxide film prior to treatment are randomly arranged and present in a mixed amorpohous/crystalline state. The heat treatment causes a part or the whole of the oxides in the film, to melt, and the film is then subjected to c-axial orientation and crystallization by gradual cooling. Especially where the substrate is formed of a metal such as silver, copper, gold or platinum or nickel, the c-axially oriented film of Bi base ceramics can easily be formed because the lattice constants of the substrate are coherent with those of the Bi—Sr—Ca—Cu—O base ceramics.

The intermediate layer, when provided, serves to promote the orientation of the ceramics and has no adverse influence upon the superconductivity of the ceramics. For instance, the intermediate layer formed of a noble metal such as silver is less reactive with superconductive phases and has good coherency with the Bi—Sr—Ca—Cu—O base ceramics in terms of the lattice constants so that the c-axial orientation of Bi-base ceramics can be easily promoted. Among the oxides of superconductive ceramics-constituting elements, MgO is less reactive with superconductive ceramics and has good coherency therewith in terms of the lattice constants of a degree enough to promote the orientation of superconductive ceramics crystals. In addition, MgO does not cause failure of superconductive phases even when a part of the intermediate layer diffuses into and combines with the superconductive phases, shows increased adhesion with respect to the film, and plays a barrier role against atoms diffusing from the substrate.

By this invention, it is possible to obtain the following advantageous effects.

(a) It is possible to simply and inexpensively make superconductive ceramics laminates of improved crystal orientation by making use of an easy-to-handle and inexpensive heat-treatment step without recourse to complicated and costly vapor deposition, sputtering, CVD and the like.

(b) When a tape-like good conductor is used as the substrate, it is possible to make up for the defect of ceramics which is that their processability is unsatisfactory and to make the laminates of this invention flexible.

(c) When a good conductor such as Ag is used as the substrate, this metal substrate provides a bypass for currents and plays a stabilization role, even when the superconductor is placed in an poorly superconductive or quenched state.

(d) When the heating conditions for heat-treating are specified in such a way that the film is heated to 860° to 950° C. to obtain a melt of a part or the whole thereof and the melt is gradually cooled, it is possible to assure the c-axial orientation of crystals by using Ag as the substrate, thereby obtaining more improved superconductive ceramics laminates.

(e) Because of the orientation of the superconductive ceramics film, it is possible to obtain superconductive laminates having a critical current density practically high enough to pass a large current through wires or tapes in their longitudinal direction.

Besides such advantages enumerated above, the second aspect of the present invention offers the following advantage.

(f) The superconductive ceramics comes into direct contact with the intermediate layer but is not brought into contact with the substrate. Thus, even a material containing an element highly reactive with ceramics and giving rise to failures of superconductive phases may be used as the substrate of this laminate. Further, use may be made of a metal material such as a heat-resistant alloy or an alloy having high mechanical strength as well as various ceramics or composite materials.

EXAMPLES

This invention will now be explained in more detail with respect to the following examples.

EXAMPLE 1

$Bi_2O_3$, $SrCO_3$, $CaCO_3$ and $CuO$ were dry-mixed together in a mortar in respective amounts of 0.5 moles, 1.0 mole, 1 mole and 2 moles, and the mixture was calcined at 800° C. for 10 hours. The calcined powders were pulverized in a mortar to a powder size of 280 mesh or less. Then, 3 parts by weight of an acrylic resin were added to 10 parts by weight of the calcined product for subsequent 30-minute mixing with a kneader. For the regulation of viscosity, drops of a solvent parapinole and plasticizer dibutyl phthalate were added to and mixed well with the mixture.

The obtained paste was formed on an Ag tape (of 0.1 mm thickness, 3 mm width and 50 mm length) as a thick film having a thickness of the order of tens to hundreds of $\mu m$ prior to firing.

The tape was dried at about 100° C., pre-treated at 400° C. for 1 hour to evaporate off the binder, and heat-treated at 880° C. for 10 minutes. After subsequent cooling at a cooling rate of 100° C./hour a superconductive ceramics-laminated tape having a thickness between 5 to 10 $\mu m$ and tens of $\mu m$ was obtained.

In order to test the superconductivity of the obtained superconductive ceramics-laminated tape, a part of the Ag tape was peeled off to determine the relationship between temperature and electrical resistivity by a usual four-terminal procedure. The results are shown in FIG. 3. From this figure, it has been found that a change of electrical resistivity depending upon temperature is metal-like, and a Tc of 78K is obtained. It has also been noted that a transition to superconduction occurs very sharply.

Figure 4:
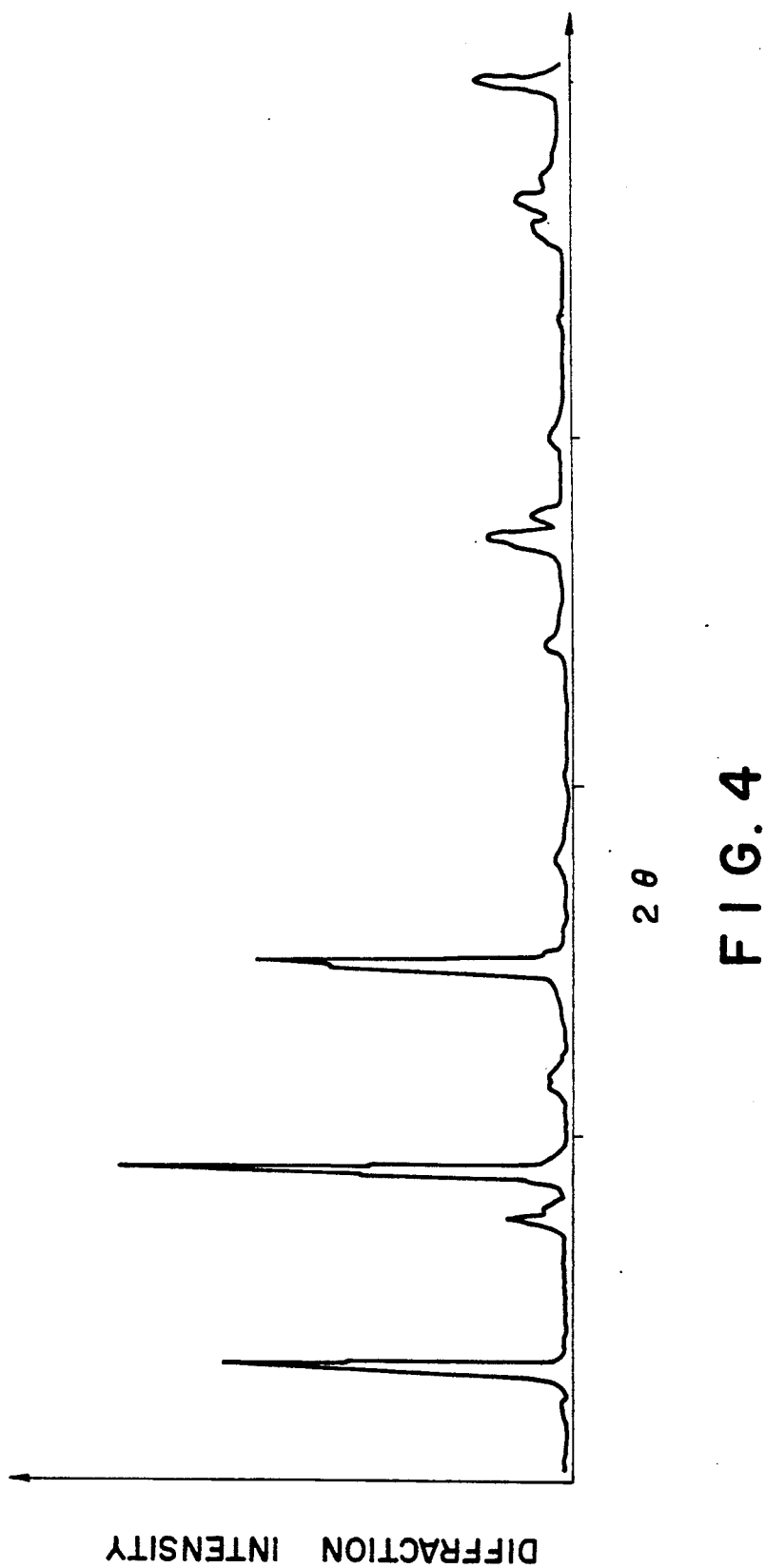
FIG. 4 is a graph showing an X-ray analysis of the composite oxide ceramics obtained in Example 1.

The crystal orientation was examined by powder X-ray diffractometry. The results are shown in FIG. 4, from which it has been found that a peak of the (00n) plane is so high and intensive that the crystals are strikingly oriented along the c-axis.

EXAMPLE 2

MgO was dry-mixed in a mortar and calcined at 800° C. for 10 hours. The calcined powders were pulverized in a mortar to a powder size of 280 mesh or less. Then, 3 parts by weight of an acrylic resin were added to 10 parts by weight of the calcined product, which step was followed by a 30-minute mixing with a kneader. For the regulation of viscosity, drops of a solvent parapinole and a plasticizer dibutyl phthalate were added to and mixed well with the mixture to obtain an MgO paste.

The MgO paste was formed as a thick film on a Hastelloy tape (a heat-resistant Ni alloy) by screen printing. The tape was fired at 900° C. for 1 hour to obtain a film thickness of 5 to 10 $\mu m$.

Separately, 0.5 moles of $Bi_2O_3$, 1 mole of $SrCO_3$, 1 mole of $CaCO_3$ and 2 moles of $CuO$ were dry-mixed together in a mortar, and the mixture was then calcinated at 800° C. for 10 hours. The calcined powders were reduced in a mortar to a powder size of 280 mesh or less. Then, 3 parts by weight of an acrylic resin were added to 10 parts by weight of the calcined product, which step was followed by a 30-minute mixing with a kneader. For the regulation of viscosity, drops of a solvent parapinole and a plasticizer dibutyl phthalate were added to and mixed well with the mixtures.

The obtained composite oxide paste was formed as a thick film on the tape having said intermediate layer by screen printing. The film thickness varied from tens of $\mu m$ to hundreds of $\mu m$, as measured prior to firing.

The tape was dried at about 100° C., pre-treated at 400° C. for 1 hour to evaporate off the binder, and heat-treated at 860° C. for 5 minutes. After subsequent cooling at a cooling rate of 100° C./hour, a superconductive ceramics-laminated tape having a film thickness between 5 to 10 $\mu m$ and tens $\mu m$ was obtained.

Figure 5:
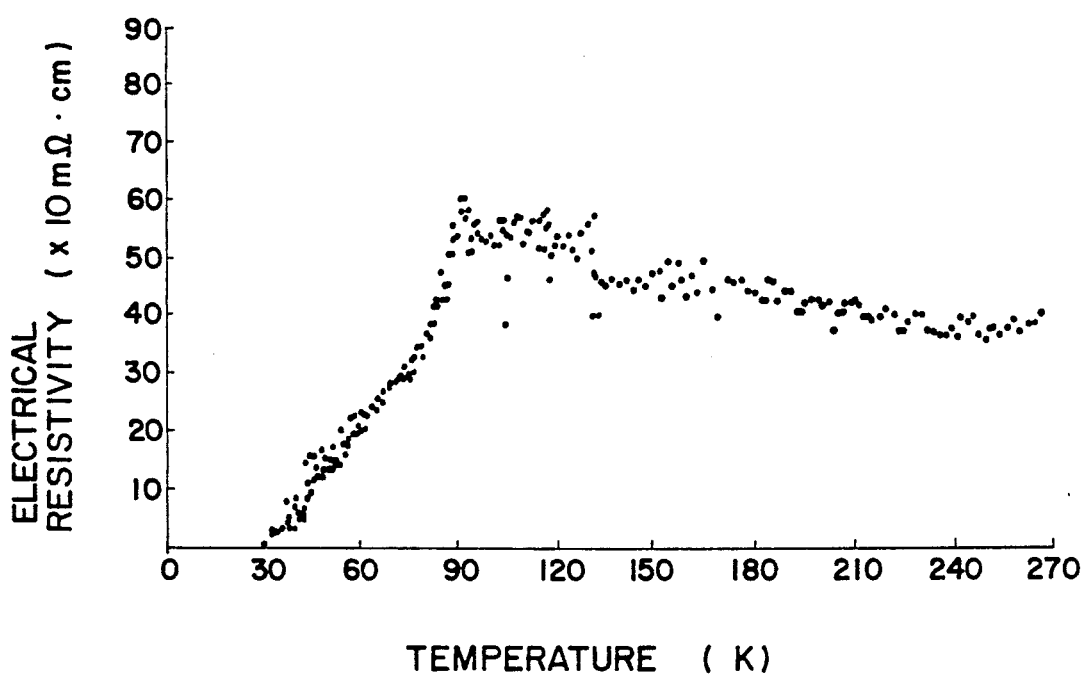
FIG. 5 is a graph indicating the relationship between temperature and electrical resistivity of the composite oxide ceramics obtained in Example 2.

In order to test the superconductivity of the obtained superconductive ceramics-laminated tape, a part of the tape was peeled off to determine the relationship between temperature and electrical resistivity by an ordinary four-terminal procedure. The results are shown in FIG. 5. As can be clearly noted from this figure, it has been found from the change of electrical resistivity depending upon temperature that a transition to superconduction begins at 90K and a Tc of 30K is obtained.

Figure 6:
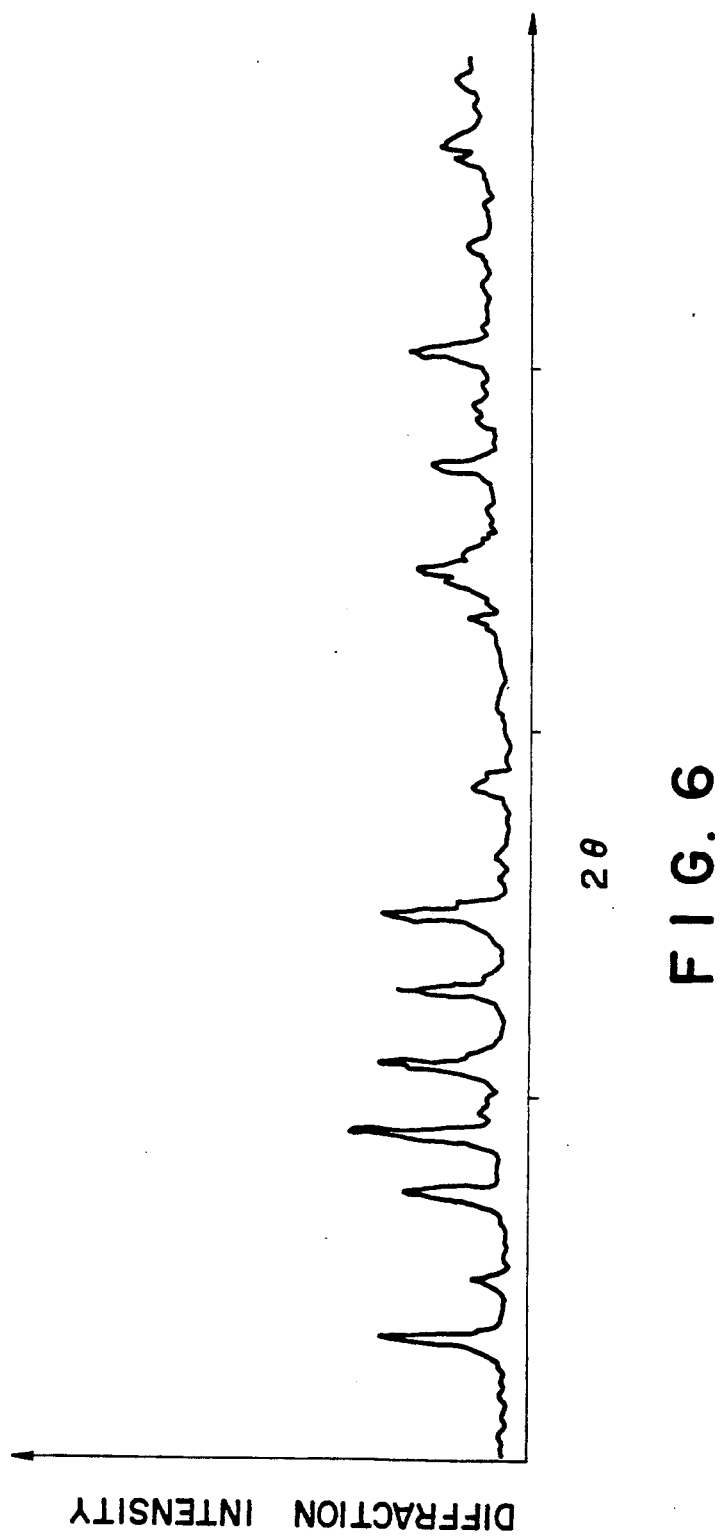
FIG. 6 is a graph showing an X-ray analysis of the composite oxide ceramics obtained in Example 2.

The crystal orientation was examined by powder X-ray diffractometry. From FIG. 6 showing the results, it has been found that the peak of the (00n) plane is so high and intensive that the crystals are strikingly oriented along the c-axis, that no reaction occurs between the Hastelloy tape and the superconductive ceramics, and that the intermediate layer of MgO promotes orientation and plays a barrier role against diffusion.

COMPARISON EXAMPLE

A ceramics laminate was prepared, similarly as described in Example 2, except that a ceramics film was formed on a Hastelloy tape not over any intermediate layer and was examined in terms of its superconductive characteristics.

As a result, it was found that the ceramics film provides an electrical insulator, whereby the heat treatment causes it to react with the components of the Hastelloy tape, thus giving rise to a failure of the superconductive phase.

EXAMPLE 3

A ceramics laminate was obtained, similarly as described in Example 2, except that the intermediate layer and substrate were formed of CuO and Ag, respectively, and the film-firing temperature applied was 900° C. The laminate was examined in terms of its superconductive characteristics.

Figure 7:
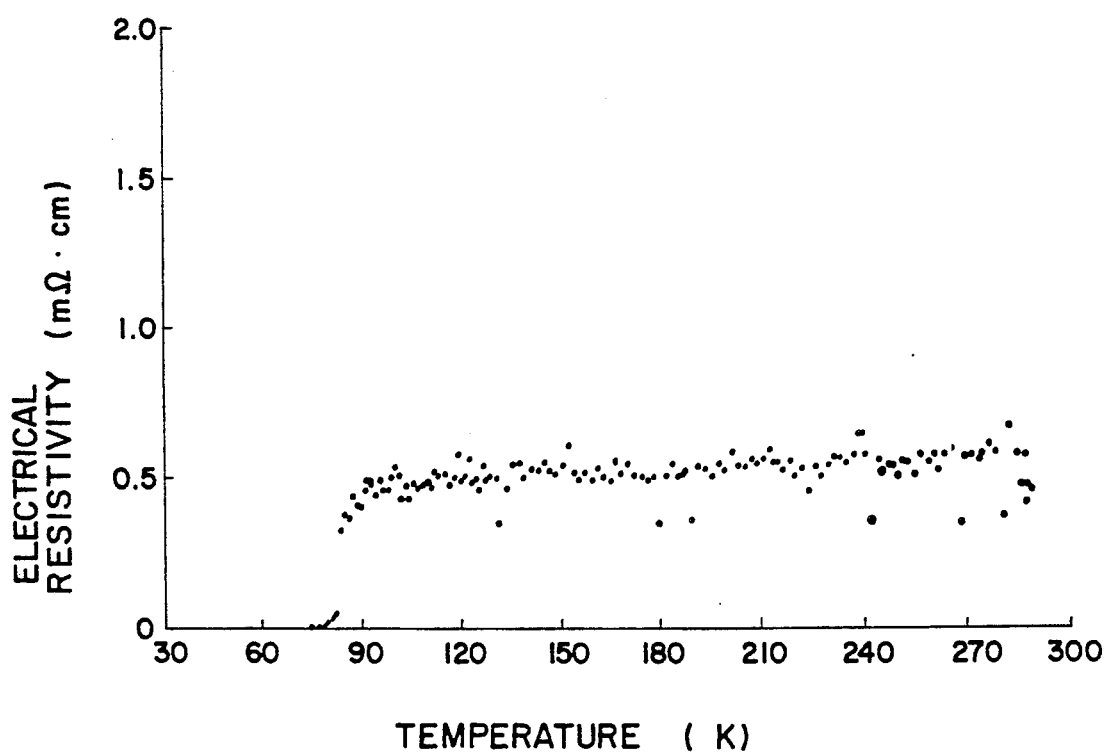
FIG. 7 is a graph indicating the relationship between temperature and electrical resistivity of the composite oxide ceramics obtained in Example 3.

In order to test the superconductive characteristics of the obtained superconductive ceramics-laminated tape, a part of the tape was peeled off to determine the relationship between temperature and electrical resistivity by an ordinary four-terminal procedure. The results are shown in FIG. 7. As can be clearly noted from this figure, a Tc of 77K was obtained.

Figure 8:
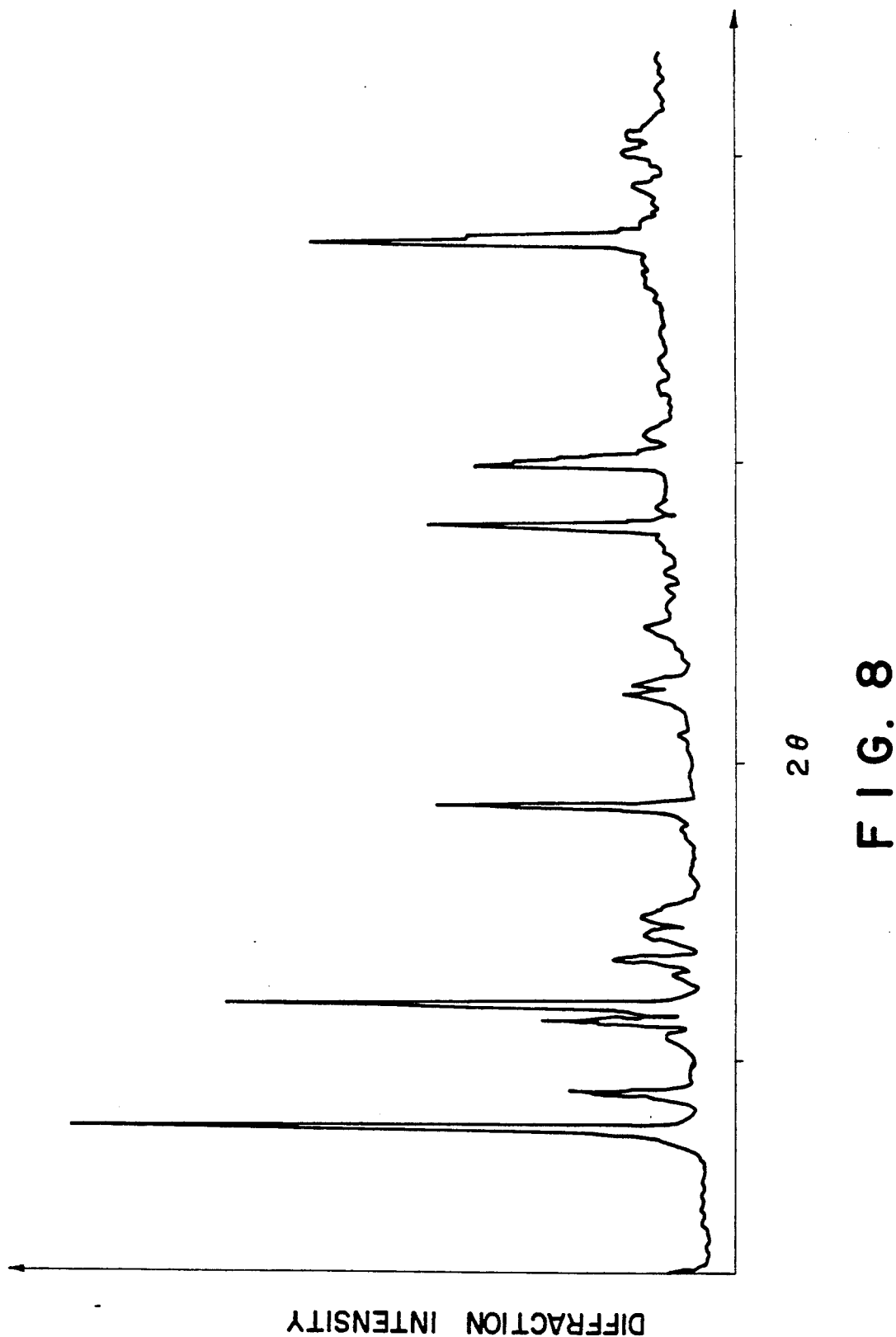
FIG. 8 is a graph showing an X-ray analysis of the composite oxide ceramics obtained in Example 3.

The crystal orientation was examined by powder X-ray diffractometry. From FIG. 8 showing the results, it has been found that the peak of the (00n) plane is so high and intensive that the crystals are strikingly oriented along the c-axis.

EXAMPLE 4

A ceramics laminate was prepared, similarly as described in Example 2, except that the intermediate layer was formed of Ag by plating and the firing temperature applied was 880° C. The laminate was examined in terms of the superconductive characteristics.

Figure 9:
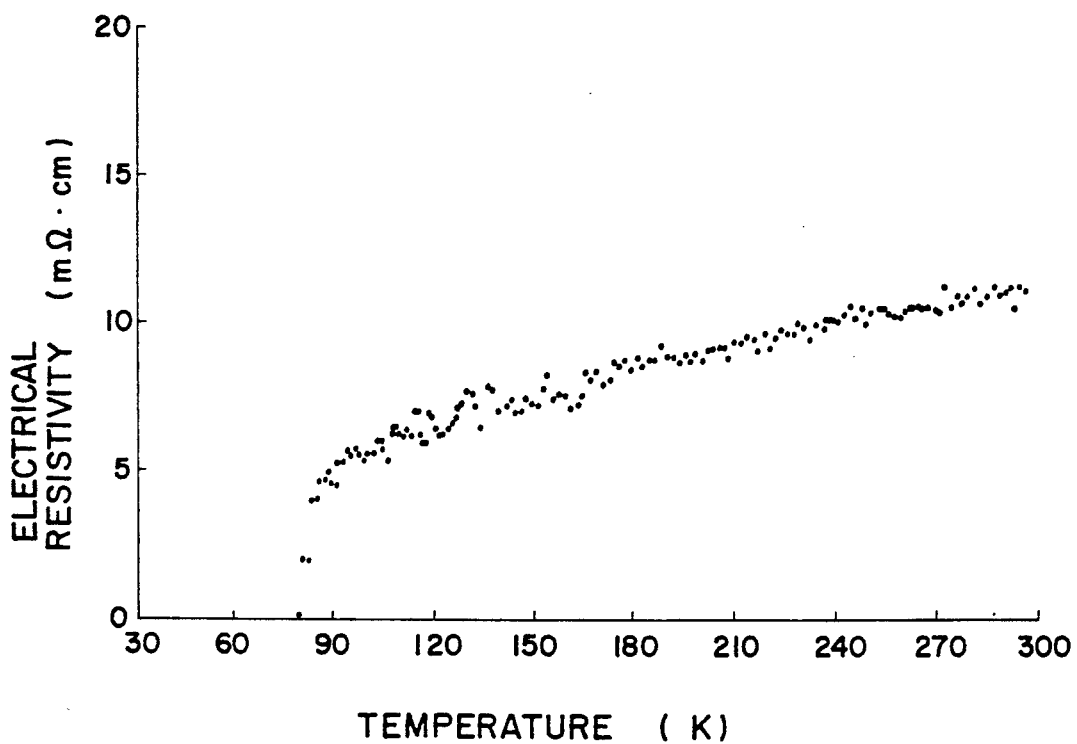
FIG. 9 is a graph indicating the relationship between temperature and electrical resistivity of the composite oxide ceramics obtained in Example 4.

To test the superconductive characteristics of the obtained superconductive ceramics-laminated tape, a part of the tape was peeled off to determine the relationship between temperature and electrical resistivity by an ordinary four-terminal procedure. The results are shown in FIG. 9, from which it was found that a Tc of 78K was obtained.

Figure 10:
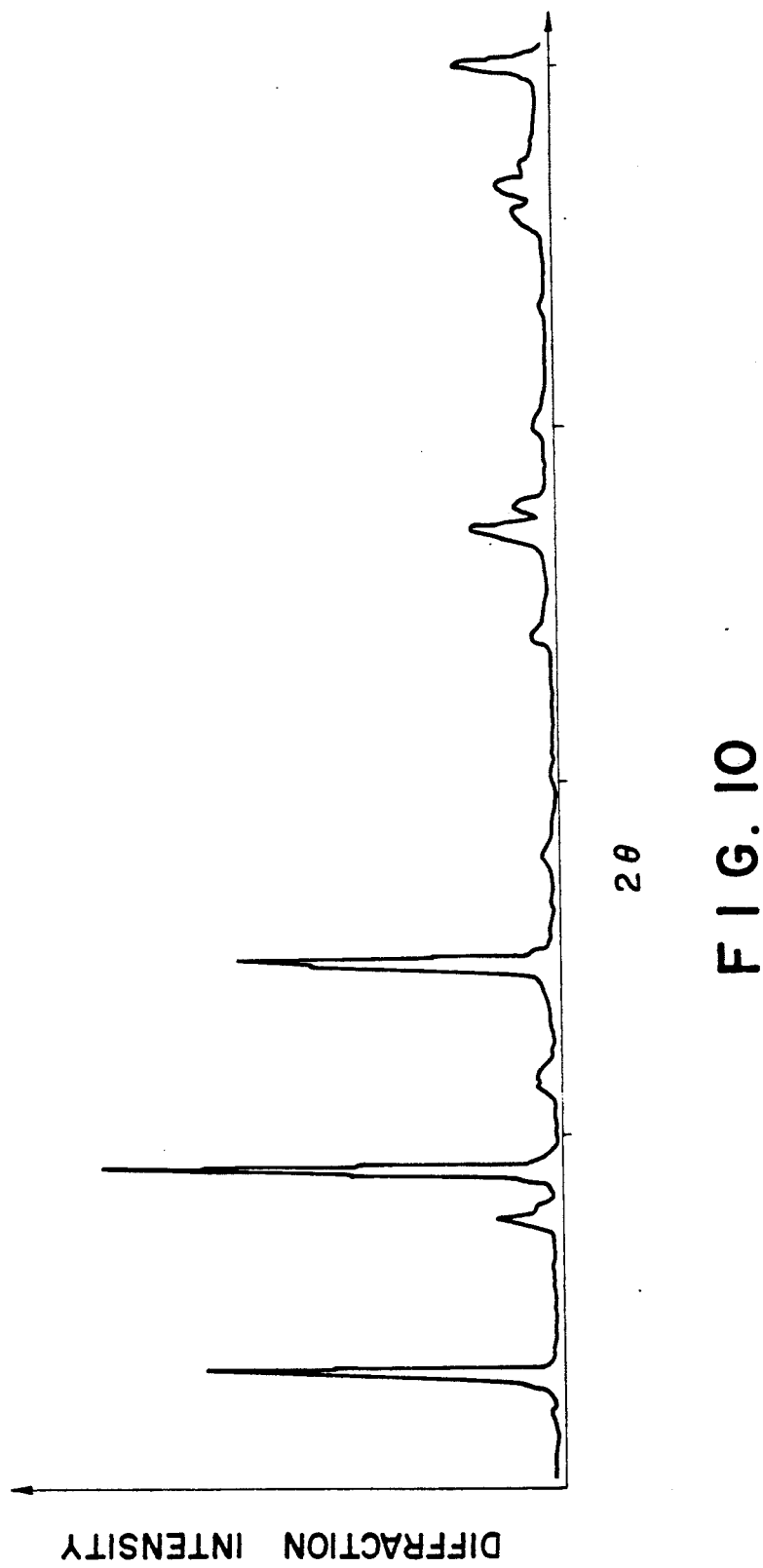
FIG. 10 is a graph showing an X-ray analysis of the composite oxide ceramics obtained in Example 4.

The crystal orientation was examined by powder X-ray diffractometry. From FIG. 10 showing the results, it was found that the peak of the (00n) plane is so high and intensive that the crystals are strikingly oriented along the c-axis.

What is claimed is:

1. A method for producing superconducting ceramics laminates which comprises screen printing a thick film of a composite oxide comprising bismuth, strontium, calcium, copper and oxygen on a plane of a nickel alloy substrate over a silver intermediate layer and heat-treating the thus formed film, wherein:

said substrate is in the form of a tape;

said composite oxide is oriented and crystallized by said heat treatment to cause its c-axis to be substantially perpendicular to a flat plane of said intermediate layer, and said intermediate layer serves to promote said orientation and has no adverse influence upon the superconductivity of the ceramics during said heat treatment, said heat treatment being carried out by heating said film to a temperature of 860° to 950° C. in an oxygenous or non-oxygenous atmosphere to melt a part or the whole thereof, and then cooling the film at the cooling rate of 500° to about 20° C. per hour.

2. The method as claimed in claim 1, wherein the heat treatment is carried out at a temperature of 870° to 910° C.

* * * * *